United States Patent [19]
Chang et al.

[11] Patent Number: 6,121,139
[45] Date of Patent: Sep. 19, 2000

[54] TI-RICH TIN INSERTION LAYER FOR SUPPRESSION OF BRIDGING DURING A SALICIDE PROCEDURE

[75] Inventors: Shou-Zen Chang, Hsin-Chu; Chaochieh Tsai, Taichung, both of Taiwan

[73] Assignee: Taiwan Semiconductor Manufacturing Company, Hsin-Chu, Taiwan

[21] Appl. No.: 09/106,336

[22] Filed: Jun. 29, 1998

[51] Int. Cl.[7] .............................................. H01L 21/4763
[52] U.S. Cl. ......................... 438/683; 438/592; 438/660; 438/682
[58] Field of Search .................................. 438/592, 682, 438/683, 660

[56] References Cited

U.S. PATENT DOCUMENTS

| | | |
|---|---|---|
| 5,462,895 | 10/1995 | Chen ........................................ 437/200 |
| 5,508,066 | 4/1996 | Akahori ................................... 427/571 |
| 5,508,212 | 4/1996 | Wang et al. .............................. 437/24 |
| 5,525,543 | 6/1996 | Chen ....................................... 437/190 |
| 5,604,155 | 2/1997 | Wang ...................................... 437/190 |
| 5,874,353 | 2/1999 | Lin et al. ................................. 438/592 |
| 5,981,383 | 11/1999 | Lur et al. ................................. 438/655 |

*Primary Examiner*—John F. Niebling
*Assistant Examiner*—Alexander G. Ghyka
*Attorney, Agent, or Firm*—George O. Saile; Stephen B. Ackerman

[57] ABSTRACT

A titanium based SALICIDE process that is free of bridging effects is described. A controlled quantity of nitrogen is delivered to the silicon oxide (or nitride) surface during titanium silicide formation. The amount of nitrogen is sufficient to inhibit outdiffusion of silicon at the dielectric areas, but insufficient to affect the sheet resistance of the silicon areas. This is accomplished by means of a titanium/titanium-rich titanium nitride/titanium sandwich that is formed in a single sputtering operation. An optional cap layer of stoichiometric titanium nitride may also be added.

20 Claims, 1 Drawing Sheet

TI-RICH TIN INSERTION LAYER FOR SUPPRESSION OF BRIDGING DURING A SALICIDE PROCEDURE

FIELD OF THE INVENTION

The invention relates to the general field of integrated circuits with particular reference to the prevention of bridging during a SALICIDE process.

BACKGROUND OF THE INVENTION

The SALICIDE (self aligned silicide) process is widely used in the manufacture of integrated circuits. It allows conductive contact to be made to very small areas of silicon (and/or areas of silicon that are very close together) separated by areas of silicon oxide or nitride.

The principle on which the process operates is that several metals, of which titanium is a prime example, react very rapidly when heated in contact with a silicon surface and are converted to their silicide. If the metal is in contact with silicon oxide or nitride during the same heat treatment, no reaction occurs. After etching in a suitable selective etch, all unreacted metal can be removed, leaving behind only the silicide which, as noted above, is limited to the silicon areas. The silicide turns out to be a reasonably good electrical conductor, particularly if it is given a second heat treatment.

Although the SALICIDE process as described above has been widely applied, it does have certain associated problems. In particular, during the first heat treatment, while the metal is in contact with the silicon oxide, a small amount of silicon gets leached out of the oxide or nitride so that a thin layer of silicide may, in fact, form on its surface. This remains in place after the selective etch (to remove unreacted metal) and forms a bridge between the intended conductive areas.

Several solutions to this problem are currently in use within the semiconductor industry. One of these involves the use of nitrogen to suppress the outdiffusion of silicon from the silicon oxide. One way of implementing this is to ion implant nitrogen into the silicon oxide prior to the deposition of the silicide forming metal. While this is effective for stopping bridging, it can lead to degradation of the silicon areas through raising their sheet resistance. Another approach is to do the silicide formation in a nitrogen ambient. This approach involves an extra process step and is also difficult to control since the nitrogen needs to diffuse through the full thickness of the metal before it can reach the silicon oxide surface and, en route, may convert much of the metal to the nitride (which has high resistivity).

Thus, what is needed is a way to deliver a controlled quantity of nitrogen to the silicon oxide surface, without transforming the metal layer to its nitride and without introducing an additional process step into the overall manufacturing process. The present invention teaches how this may be done using titanium as the silicide forming metal, but it will be understood that the process of the present invention could be modified to similarly improve the SALICIDE process when used with other silicide forming metals such as cobalt or tungsten.

In the course of searching the prior art, several references that teach ways to deposit titanium and titanium nitride films were found but none of these teach (or could be combined to teach) the process of the present invention. For example, Wang et al. (U.S. Pat. No. 5,508,212 April 1996) coat a silicon surface with titanium and then convert the latter to titanium nitride through ion implantation. After an RTA, excess unreacted TiN is removed in the usual way.

Wang (U.S. Pat. No. 5,604,155 February 1997) deposits a titanium layer followed by an aluminum layer. After heating, Ti—Al alloy is formed which allows the removal of precipitates and eliminates bridging.

Chen (U.S. Pat. No. 5,462,895 October 1995) uses CVD (chemical vapor deposition) to form an adhesive layer inside a contact hole that is later filled with tungsten. By changing the ratio of ammonia to titanium chloride in the precursor gases, a two layer film of stoichiometric titanium nitride over titanium-rich titanium nitride is formed. In U.S. Pat. No. 5,525,543 (June 1996), which is a divisional of U.S. Pat. No. 5,462,895, Chen describes several additional embodiments.

Akahori (U.S. Pat. No. 5,508,066 April 1996) teach the advantages of depositing titanium by means of plasma enhanced CVD.

SUMMARY OF THE INVENTION

It has been an object of the present invention to provide a titanium based SALICIDE process wherein bridging between silicon areas is absent.

Another object of the invention has been that said process not degrade the sheet resistance of the silicon areas.

A further object has been that said process not introduce additional steps into the overall manufacturing process (including the SALICIDE portion thereof).

These objects have been achieved by delivering a controlled quantity of nitrogen to the silicon oxide (or nitride) surface during titanium silicide formation. The amount of nitrogen is sufficient to inhibit outdiffusion of silicon but insufficient to affect the sheet resistance of the silicon areas. This is accomplished by means of a titanium/titanium-rich titanium nitride/titanium sandwich that is formed in a single sputtering operation. An optional cap layer of stoichiometric titanium nitride may also be used.

DESCRIPTION OF THE PREFERRED EMBODIMENTS

Although we will describe the process of the present invention in the context of the manufacture of a field effect device followed by the application of the full SALICIDE process, it will be understood by those skilled in the art that the process of the present invention could be used in any situation where selective contact to silicon, in the presence of dielectric areas such as silicon oxide or silicon nitride, is required.

Figure 1:
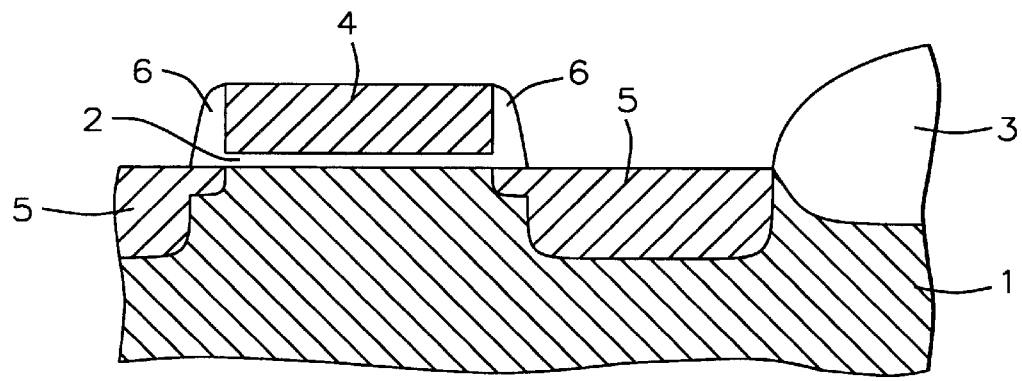
FIG. 1 shows a typical field effect transistor prior to the formation of contacts to the gate, source, and drain regions.

Referring now to FIG. 1, the process of the present invention begins with the provision of silicon substrate 1 having a layer of gate oxide 2 and regions of field oxide such as 3. Polysilicon layer 4 is deposited over the gate oxide and field oxide and is then patterned and etched to form a gate pedestal, as shown.

Gate oxide not covered by the gate pedestal is removed and source/drain regions are formed in the silicon between the field oxide and the gate pedestal. Also seen in FIG. 1 are the spacers 6 which are layers of dielectric (most commonly silicon nitride or silicon oxide) that coat the vertical sidewalls of the gate pedestal. Their purpose is to facilitate the formation of the so-called low density drain (LDD) which gives rise to the asymmetric appearance of the source/gate regions, but they are also vital to the SALICIDE process as they provide the electrical separation between the gate and the source/drains.

Figure 2:
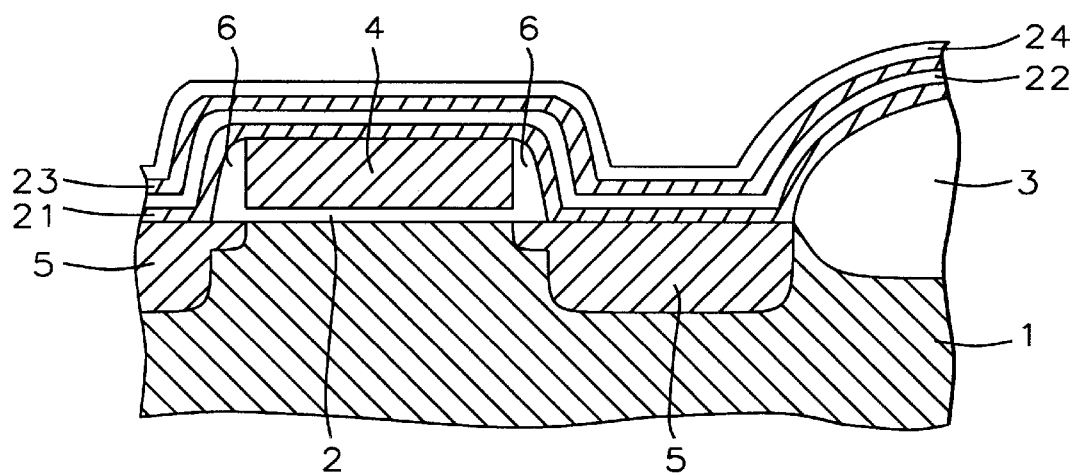
FIG. 2 shows a sandwich of titanium/titanium-rich titanium nitride/titanium (with a cap of titanium nitride) covering the structure of FIG. 1.

Referring now to FIG. 2, the structure seen in FIG. 1 is placed in a sputtering chamber and an inert gas, such as argon is admitted and maintained at a pressure between about 2 and 3 mtorr. Using a titanium cathode (target), a glow discharge is initiated at a power level between about 2,000 and 3,000 watts per sq. cm. of target. This results in the deposition of pure titanium layer 21. Our preferred thickness for layer 21 has been about 150 Angstroms but any thickness between about 100 and 250 Angstroms would still work.

Leaving all else unchanged, a small amount of nitrogen is added to the sputtering atmosphere. Typically, the volume percent of nitrogen (in the argon-nitrogen mix) is about 5% but any percentage between about 2 and 20% would still work. The addition of nitrogen (in the above concentrations) to the sputtering atmosphere leads to the formation of titanium-rich titanium nitride layer 22 in which the departure from stoichiometry is between about 35 and 48 atomic percent (excess titanium over stoichiometry). Our preferred thickness for layer 22 has been about 25 Angstroms but any thickness between about 10 and 50 Angstroms would still work.

Layer 22 is key to the successful operation of the present invention. It delivers nitrogen to the silicon oxide (or nitride) surfaces before any interior silicon has had a chance to diffuse to those surfaces (thereby preventing subsequent bridging) and it also limits the quantity of nitrogen arriving at the silicon surfaces so that silicon nitride does not form there.

Once layer 22 has been laid down, the nitrogen is once more removed from the inert atmosphere (again, without changing anything else) and a second layer 23 of pure titanium is now deposited. Our preferred thickness for layer 23 has been about 150 Angstroms but any thickness between about 100 and 200 Angstroms would still work. Layer 23 combines with layer 21 to form the final titanium interface for SALICIDE formation while layer 22 acts as a nitrogen insertion layer in this titanium scheme for bridge suppression. The percentage of titanium reacting with silicon in layer 23 depends on the thickness and nitrogen concentration of layer 22.

At this point in the process, the manufacturer may elect to proceed directly to the rapid thermal anneal (RTA) steps described below or an optional layer 24 of stoichiometric titanium nitride may be deposited over the second layer 23 of titanium. The preferred method for depositing layer 24 has been CVD and a thickness between about 100 and 200 Angstroms has been found to work well. The reason such a cap layer is sometimes used is to block the formation of titanium oxide.

Figure 3:
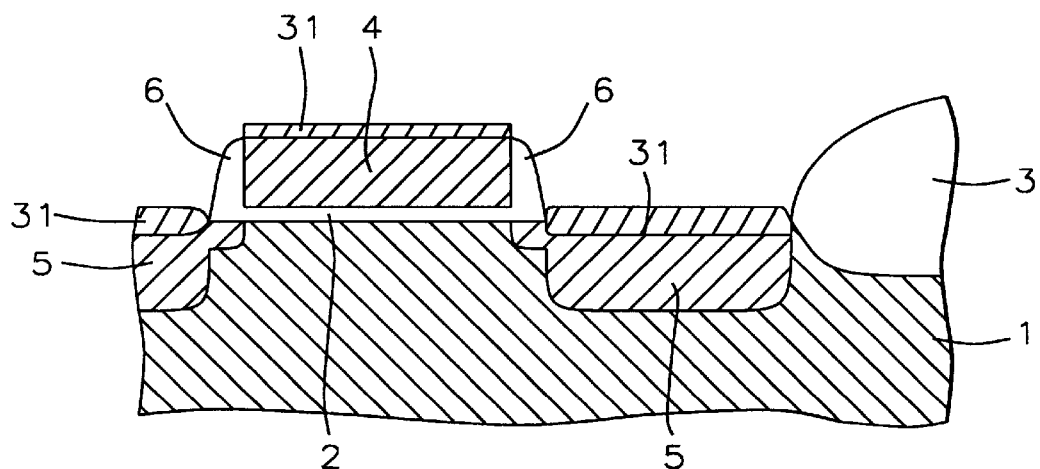
FIG. 3 shows the result of an RTA and selective etching whereby regions of conductive titanium silicide are present over the silicon but not over the dielectric areas.

Whether or not layer 24 is laid down, the next step in the process is to subject the silicon to a first RTA at between about 650 and 740° C. for between about 10 and 30 seconds. During this first RTA, the titanium reacts with the silicon (wherever it is in direct contact with it) to form titanium silicide 31 as shown in FIG. 3. All unreacted titanium is then removed by etching in a solution of hydrogen peroxide and ammonia for between about 30 and 50 minutes. This etchant does not attack titanium silicide, so no conductive material remains, except on silicon surfaces, giving the structure, at the conclusion of the process, the appearance presented in FIG. 3.

It turns out that the titanium silicide formed during the first RTA has a relatively high resistivity (about 20–40 ohm cm.) because of its crystal structure (known as C49). Fortunately, a small amount of additional heat treatment is sufficient to transform it into the C54 crystal structure whose resistivity is significantly lower (about 2–4 ohm cm.). This second heat treatment takes the form of an RTA at between about 820 and 880° C. for between about 10 and 30 seconds.

While the invention has been particularly shown and described with reference to the preferred embodiments thereof, it will be understood by those skilled in the art that various changes in form and details may be made without departing from the spirit and scope of the invention.

What is claimed is:

1. A process to eliminate bridging during selective formation of titanium silicide, comprising:

provinding a surface that includes a region comprising silicon and a region comprising a dielectric material;

through sputtering in an inert atmosphere, depositing on said surface a first layer of titanium;

by adding nitrogen to said inert atmosphere, depositing on said first layer of titanium a layer of titanium-rich titanium nitride;

removing the nitrogen from the inert atmosphere and then depositing on said layer of titanium-rich titanium nitride a second layer of titanium;

heating the surface whereby the titanium selectively reacts with the silicon to form titanium silicide; and selectively removing all unreacted titanium.

2. The process of claim 1 wherein said first layer of titanium is deposited to a thickness between about 100 and 250 Angstroms.

3. The process of claim 1 wherein said layer of titanium-rich titanium nitride is deposited to a thickness between about 10 and 50 Angstroms.

4. The process of claim 1 wherein said second layer of titanium is deposited to a thickness between about 100 and 200 Angstroms.

5. The process of claim 1 wherein the inert atmosphere comprises argon at a pressure between about 2 and 3 mtorr and sputtering is performed at a power density of between about 2,000 and 3,000 watts per sq. cm. of target.

6. The process of claim 1 wherein the nitrogen that is added to said inert atmosphere during the deposition of said layer of titanium-rich titanium nitride is present at a concentration between about 2 and 15 volume %.

7. The process of claim 1 wherein the excess of titanium in said layer of titanium-rich titanium nitride is between about 35 and 48 atomic percent over stoichiometry.

8. The process of claim 1 further comprising:

after depositing the second layer of titanium and before heating the surface, depositing on said second layer of titanium, by means of chemical vapor deposition, a layer of stoichiometric titanium nitride.

9. The process of claim 8 wherein said layer of stoichiometric titanium nitride is deposited to a thickness between about 10 and 50 Angstroms.

10. A SALICIDE process, free of bridging, comprising the sequential steps of:

providing a silicon substrate having a layer of gate oxide and regions of field oxide;

depositing a layer of polysilicon onto the layers of gate oxide and field oxide;

patterning and etching the layer of polysilicon to form a gate pedestal centrally located between two regions of field oxide;

forming dielectric spacers on all vertical sidewalls of said gate pedestal;

removing gate oxide not covered by the gate pedestal and then forming source and drain regions between the field oxide and the gate pedestal;

through sputtering in an inert atmosphere, depositing a first layer of titanium;

by adding nitrogen to said inert atmosphere, depositing on said first layer of titanium a layer of titanium-rich titanium nitride;

removing the nitrogen from the inert atmosphere and then depositing on said layer of titanium-rich titanium nitride a second layer of titanium;

subjecting the silicon substrate to a first rapid thermal anneal whereby the titanium selectively reacts with the silicon to form titanium silicide;

selectively removing all unreacted titanium; and subjecting the silicon substrate to a second rapid thermal anneal whereby the resistivity of the silicide is reduced.

11. The process of claim 10 wherein said first layer of titanium is deposited to a thickness between about 100 and 250 Angstroms.

12. The process of claim 10 wherein said layer of titanium-rich titanium nitride is deposited to a thickness between about 10 and 50 Angstroms.

13. The process of claim 10 wherein said second layer of titanium is deposited to a thickness between about 100 and 200 Angstroms.

14. The process of claim 10 wherein the inert atmosphere comprises argon at a pressure between about 2 and 3 mtorr and sputtering is performed at a power density of between about 2,000 and 3,000 watts per sq. cm. of target.

15. The process of claim 10 wherein the nitrogen that is added to said inert atmosphere during the deposition of said layer of titanium-rich titanium nitride is present at a concentration between about 2 and 20 volume %.

16. The process of claim 10 wherein the excess of titanium in said layer of titanium-rich titanium nitride is between about 35 and 48 atomic percent above stoichiometry.

17. The process of claim 10 wherein the first rapid thermal anneal comprises:

heating to a temperature between about 650 and 740° C. for between about 10 and 30 seconds.

18. The process of claim 10 wherein the second rapid thermal anneal comprises:

heating to a temperature between about 820 and 880° C. for between about 10 and 30 seconds.

19. The process of claim 10 further comprising:

after depositing the second layer of titanium and before the first rapid thermal anneal, depositing on said second layer of titanium, by means of chemical vapor deposition, a layer of stoichiometric titanium nitride.

20. The process of claim 19 wherein said layer of stoichiometric titanium nitride is deposited to a thickness between about 100 and 200 Angstroms.

* * * * *